United States Patent [19]

McClure

[11] Patent Number: 5,712,584
[45] Date of Patent: Jan. 27, 1998

[54] SYNCHRONOUS STRESS TEST CONTROL

[75] Inventor: David Charles McClure, Carrollton, Tex.

[73] Assignee: SGS-Thomson Microelectronics, Inc., Carrollton, Tex.

[21] Appl. No.: 589,015

[22] Filed: Jan. 19, 1996

[51] Int. Cl.⁶ .................................................. H03K 5/13
[52] U.S. Cl. .......................... 327/198; 327/143; 327/202; 327/213
[58] Field of Search ................................ 327/198, 142, 327/143, 202, 203, 206, 211, 213

[56] References Cited

U.S. PATENT DOCUMENTS

| | | | |
|---|---|---|---|
| 5,251,181 | 10/1993 | Toda | 365/230.08 |
| 5,258,952 | 11/1993 | Coker | 365/194 |
| 5,267,197 | 11/1993 | McClure | 365/189.01 |
| 5,267,210 | 11/1993 | McClure | 365/218 |
| 5,293,623 | 3/1994 | Froniewski et al. | 395/425 |
| 5,300,828 | 4/1994 | McClure | 307/443 |
| 5,305,268 | 4/1994 | McClure | 365/203 |
| 5,311,467 | 5/1994 | Lysinger et al. | 365/189.01 |
| 5,323,066 | 6/1994 | Feddeler et al. | 327/142 |
| 5,341,341 | 8/1994 | Fukuzo | 365/233 |
| 5,477,176 | 12/1995 | Chang et al. | 327/142 |
| 5,510,740 | 4/1996 | Farrell et al. | 327/142 |
| 5,521,878 | 5/1996 | Ohtani et al. | 365/233 |
| 5,539,347 | 7/1996 | Duesman | 327/142 |

Primary Examiner—Timothy P. Callahan
Assistant Examiner—T. Lam
Attorney, Agent, or Firm—Theodore E. Galanthay; Lisa K. Jorgenson; Renee M. Larson

[57] ABSTRACT

The present invention ensures that the entire data path of the synchronous integrated circuit device composed of master and slave latches is initialized upon power-up in a test mode, thereby overcoming a prior art problem of non-initialization of the device data path. In the test mode, the master clock signal is initialized internally to the synchronous integrated circuit device to allow the master latch to conduct. A clock signal which is a derivative of a master clock signal is controlled to be equal to a first logic state in order to control a slave latch element of the synchronous integrated circuit device to conduct, regardless of the state of the master clock signal. Controlling the clock signal to be equal to the first logic state allows the clock signal to be able to control the slave latch element so that entire data path of the integrated circuit device is initialized upon power-up of the device in the test mode. The logic state of the clock signal is controlled by a clock control circuit which sets the logic state of the clock as a function of whether the device is in a test mode. Thus, the master clock signal which controls the master latch element and the clock signal which controls the slave latch element are controlled such that the master latch and the slave latch conduct simultaneously for proper and full initialization of the device data path upon power-up of the device in a test mode.

45 Claims, 4 Drawing Sheets

SYNCHRONOUS STRESS TEST CONTROL

CROSS REFERENCE TO RELATED APPLICATIONS

The subject matter of the present application is related to copending U.S. application No. 08/173,197, filed Dec. 22, 1993, titled "Improved Static Memory Long Write Test", attorney docket no. 93-C-82, copending U.S. application No. 08/172,854, filed Dec. 22, 1993, titled "Stress Test Mode", attorney docket no. 93-C-56 all of which are assigned to SGS-Thomson Microelectronics, Inc. and expressly incorporated herein by reference.

Additionally, the following pending U.S. Patent Applications by David Charles McClure entitled:

"Architecture Redundancy", Ser. No. 08/582,424 (Attorney's Docket No. 95-C-136), and "Redundancy Control", Ser. No. 08/580,827 (Attorney's Docket No. 95-C143), which were both filed on Dec. 29, 1995, and have the same ownership as the present application, and to that extent are arguable related to the present application, which are herein incorporated by reference; and entitled:

"Test Mode Activation and Data Override", Ser. No. 08/587,709 (Attorney's Docket No. 95-C-137), "Pipelined Chip Enable Control Circuitry and Methodology", Ser. No. 08/588,730 (Docket No. 95-C-138), "Output Driver Ciruitry Having a Single Slew Rate Resistor", Ser. No. 08/588,988 (Docket No. 95-C-139), "Synchronized Stress Test Control", Ser. No. 08/589,015 (Docket No. 95-C-142), "Write Pass Through Circuit", Ser. No. 08/588,662 (Attorney's Docket No. 95-C-144), "Data-Input Device for Generating Test Signals on Bit and Bit-Complement Lines", Ser. No. 08/588,762 (Attorney's Docket No. 95-C-145), "Synchronous Output Circuit", Ser. No. 08/588,901 (Attorney's Docket No. 95-C-146), "Write Driver Having a Test Function", Ser. No. 08/589,141 (Attorney's Docket No. 95-C-147), "Circuit and Method for Tracking the Start of a Write to a Memory Cell", Ser. No. 08/589,139 (Attorney's Docket No. 95-C-148), "Circuit and Method for Terminating a Write to a Memory Cell", Ser. No. 08/588,737 (Attorney's Docket No. 95-C-149), "Clocked Sense Amplifier with Wordline Tracking", Ser. No. 08/587,728 (Attorney's Docket No. 95-C-150), "Memory-Row Selector Having a Test Function", Ser. No. 08/589,140 (Attorney's Docket No. 95-C-151), "Synchronous Test Mode Initialization", Ser. No. 08/588,729 (Docket No. 95-C-153), "Device and Method for Isolating Bit Lines from a Data Line", Ser. No. 08/588,740 (Attorney's Docket No. 95-C-154), "Circuit and Method for Setting the Time Duration of a Write to a Memory Cell", Ser. No. 08/587,711 (Attorney's Docket No. 95-C-156), "Low-Power Read Circuit and Method for Controlling A Sense Amplifier", Ser. No. 08/589,024 (Attorney's Docket No. 95-C-168), "Device and Method for Driving a Conductive Path with a Signal", Ser. No. 08/587,708 (Attorney's Docket No. 169), and the following pending U.S. Patent Applications by Mark A. Lysinger entitled:

"Burst Counter Circuit and Method of Operation Thereof", Ser. No. 08/589,023 (Attorney's Docket No. 95-C-141), "Switching Master/Slave Circuit", Ser. No. 08/588,648 (Attorney's Docket No. 96-C-03), which have the same effective filing data and ownership as the present application, and to that extent are arguably related to the present application, are incorporated herein by reference.

BACKGROUND OF THE INVENTION

The present invention relates generally to the testing of integrated circuit devices, and more specifically to the testing of synchronous integrated circuit devices having a stress test mode.

Stress test modes are commonly used in modern integrated circuit devices to subject the integrated circuit device to various types of tests which "stress" the device. Difficulties are encountered in trying to establish the logic states of the device during a stress test mode. These difficulties are encountered in a memory cell stress test mode of the device, in which all rows and columns are enabled and bitlines true or bitlines complement of the memory cell are pulled to power supply voltage Vss, or in a periphery stress test mode in which all rows and columns of the device are disabled. The difficulty lies in the fact that master latches and slave latches (flip-flops) on the inputs of the synchronous integrated circuit device do not allow data to flow all the way through the device since only the master latch or the slave latch will conduct at any given time based upon the logic state of the integrated circuit device clock.

Another prior art problem encountered with synchronous integrated circuit test modes is that entering a test mode after the integrated circuit device has been powered-up can result in device latch-up. Once the device powers-up, it has initialized to a certain voltage, such as 3 volts or 5 volts. Transition to a test mode from this voltage condition causes huge current spikes which can result in device latch-up as all the rows, columns, bitlines, etc. of the device simultaneously switch from a normal operating mode to a test mode. It would thus be desirable to enter a test mode upon power-up of the device in order to avoid possible device latch-up.

There is thus an unmet need in the art to be able to initialize the entire data path of an synchronous integrated circuit device in a test mode upon power-up of the device.

SUMMARY OF THE INVENTION

It is an object of the present invention to initialize the entire data path of a synchronous integrated circuit device in a test mode upon power-up of the device.

Therefore, according to the present invention, the entire data path of the integrated circuit device is initialized upon power-up of the integrated circuit device in a test mode, thereby overcoming a prior art problem of non-initialization of the device data path. In a test mode, the master clock is controlled to conduct the master latch element. A clock signal which is a derivative of a master clock signal is controlled to be equal to a first logic state in order to control a slave latch (flip-flop) element of the synchronous integrated circuit device, regardless of the state of the master clock signal. Controlling the clock signal to be equal to the first logic state allows the clock signal to control the slave latch element so that entire data path of the synchronous integrated circuit device is initialized. Thus, the master clock signal which controls the master latch element and the clock signal which controls the slave latch element are controlled such that the master latch and the slave latch conduct simultaneously for proper and full initialization of the device data path upon power-up of the device in a test mode.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

FIGS. 1 to 6 illustrate just one example of how the present invention may be used to initialize the entire data path of a synchronous integrated circuit memory device upon power-up of the device in a stress test mode. The present invention controls the clock signals which control the master latches (flip-flops) and slave latches (flip-flops) of the device so that upon power-up in the test mode, both the master latches and the slave latches conduct to initialize the entire device data path. As is understood in the art, a synchronous integrated circuit device is a device that is controlled by a master clock and that has address paths having master and slave latches to register addresses on either the rising edge or the falling edge of the master clock or a derivative signal of the master clock.

Figure 1:
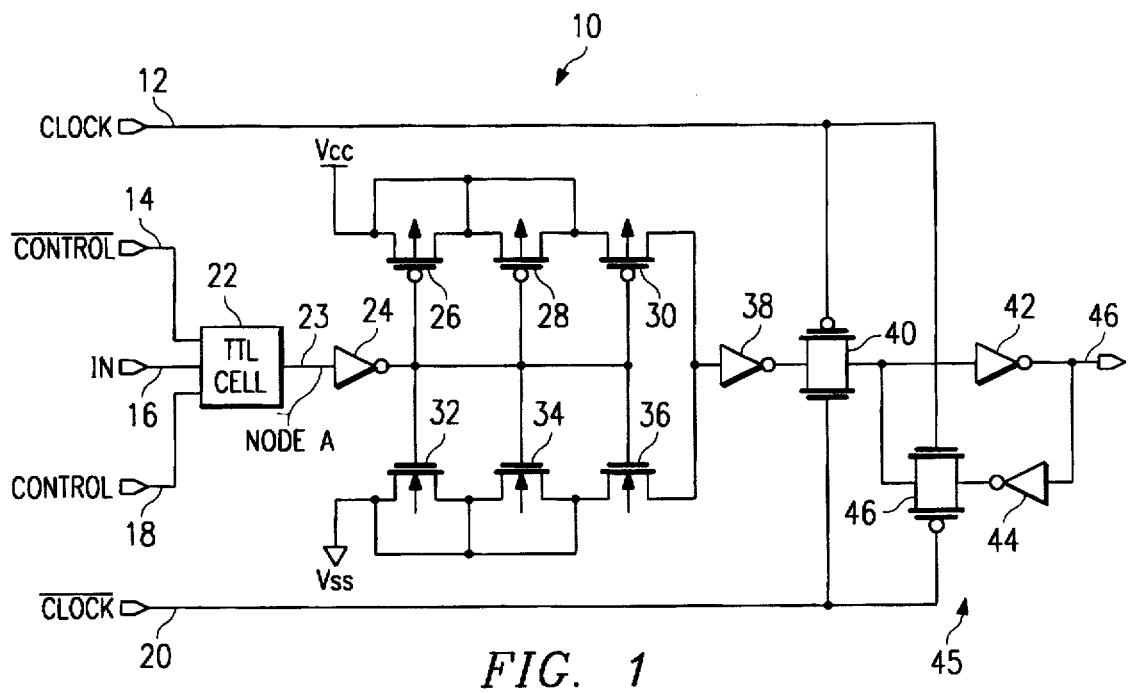
FIG. 1 is a schematic diagram of an address input buffer, according to the present invention.
Figure 1A:
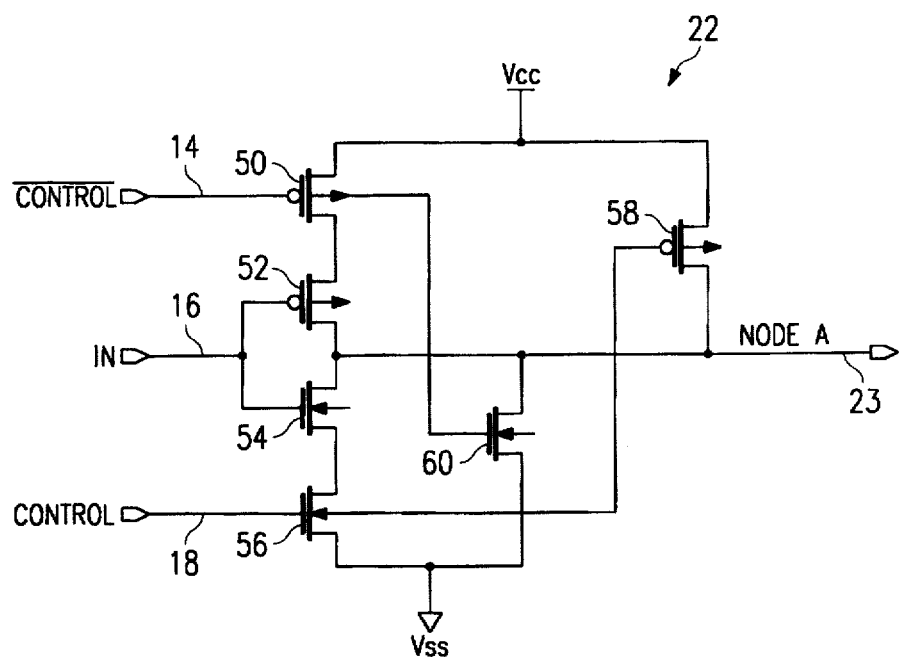
FIG. 1a is a schematic diagram of a TTL (transistor transistor logic) memory cell, according to the present invention.
Figure 2:
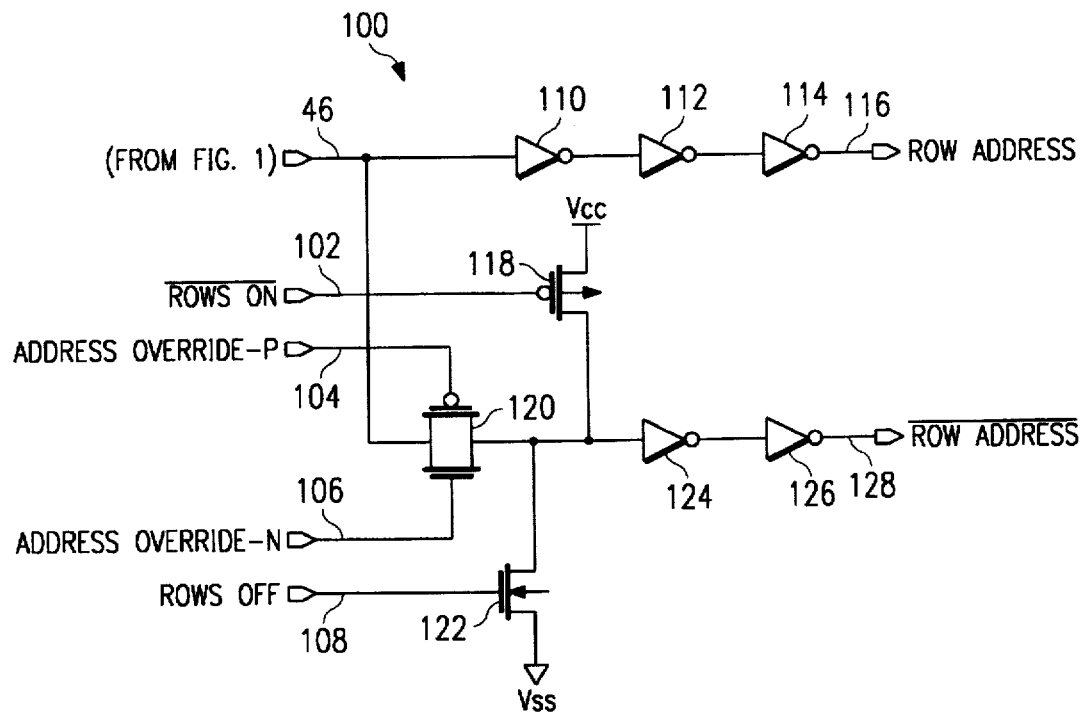
FIG. 2 is a schematic diagram of row address driver circuitry, according to the present invention.

Referring to FIG. 1, a schematic diagram of an address input buffer 10, according to the present invention, is shown. Address input buffer 10 includes the following elements: TTL (transistor transistor logic) cell 22, inverters 24, 38 42 and 44, and passgates 40 (master latch) and 46. The details of TTL cell 22 are shown in FIG. 1a. Address input buffer 10 contains a master latch 45 comprised of elements inverter 42, inverter 44 and passgate 46. Address input buffer 10 is supplied with the following input signals: Clock signal 12 (the master clock signal), Control bar signal 14, IN signal 16, Control signal 18 and Clock bar signal 20 and generates signal 46 as an output signal.

Control bar signal 14 and Control signal 18 control TTL cell 22 shown in FIG. 1a. TTL cell 22 contains the following elements: p-channel MOS transistors 50, 52 and 58 and n-channel MOS transistors 54, 56 and 60. The gates of transistors 50 and 60 are supplied with Control bar signal 14. The gates of transistors 52 and 54 are supplied with IN signal 16, and the gates of transistors 56 and 58 are supplied with the Control signal 18. A first source/drain of transistor 50 and a first source/drain of transistor 58 are connected to power supply voltage Vcc as shown. A second source/drain of transistor 50 is connected to a first source/drain of transistor 52. A second source/drain of transistor 52 is connected to a first source/drain of transistor 54, a first source/drain of transistor 60 and a second source/drain of transistor 58 to form output signal 23 on Node A. A second source/drain of transistor 54 is connected to a first source/drain of transistor 56. A second source/drain of transistor 56 is connected to a second source/drain of transistor 60 and power supply voltage Vss.

Referring again to FIG. 1, based upon the logic state of Control bar signal 14 and Control signal 18, node A is forced to a high or low logic state in a test mode. Clock signal 12 is forced to a low logic state in a test mode, so that master latch 45 is conducting and output signal 46 is generated. Output signal 46 feeds row address driver circuitry 100 of FIG. 2. Row address driver circuitry 100 is composed of inverters 110, 112, 114, 124 and 126, p-channel MOS transistor 118, n-channel MOS transistor 122, and passgate 120. Signal 46 from FIG. 1 is provided to a series of inverters 110, 112 and 114 which delay and invert signal 46 to produce Row Address signal 116. Signal 46 is also presented to passgate 120 which is controlled by Address Override-P signal 104 and Address Override-N signal 106. The output signal of passgate 120 is pulled up towards Vcc by p-channel transistor 118 whose gate is controlled by Rows On bar signal 102 and is pulled down towards Vss by n-channel transistor 122 whose gate is controlled by Rows Off signal 108. The output signal of passgate 120 passes through two inverters 124 and 126 to become Row Address bar signal 128. Row Address bar signal 128 is the inverse of Row Address signal 116. Rows On bar signal 102 forces Row Address bar signal 128 on (in an asserting condition) when it is a low logic state in the test mode and Rows Off signal 108 forces Row Address bar signal 128 off (not in an asserting condition) when it is a high logic state in the test mode. P-channel MOS transistor 118 and n-channel MOS transistor 122 act as row address override devices in the test mode.

Rows On bar signal 102 and Rows Off signal 108 are controlled based upon which type of test mode being entered: a memory cell stress mode in which all rows are enabled or a periphery stress mode in which all the rows are disabled. Based on the logic states of signal 46, Rows On bar signal 102 and Rows Off signal 108 and further based upon the fact that Address Override-P signal 104 is a high logic state and Address Override-N signal 106 is a low logic state in any test mode, Row Address signal 116 and Row Address bar signal 128 are both forced to a high logic state in a memory cell stress mode in an asserting condition for the Row Pre-Decoder circuitry 130 of FIG. 3 which is controlled by FIG. 2 or are both forced to a low logic state in a periphery stress mode.

Figure 3:
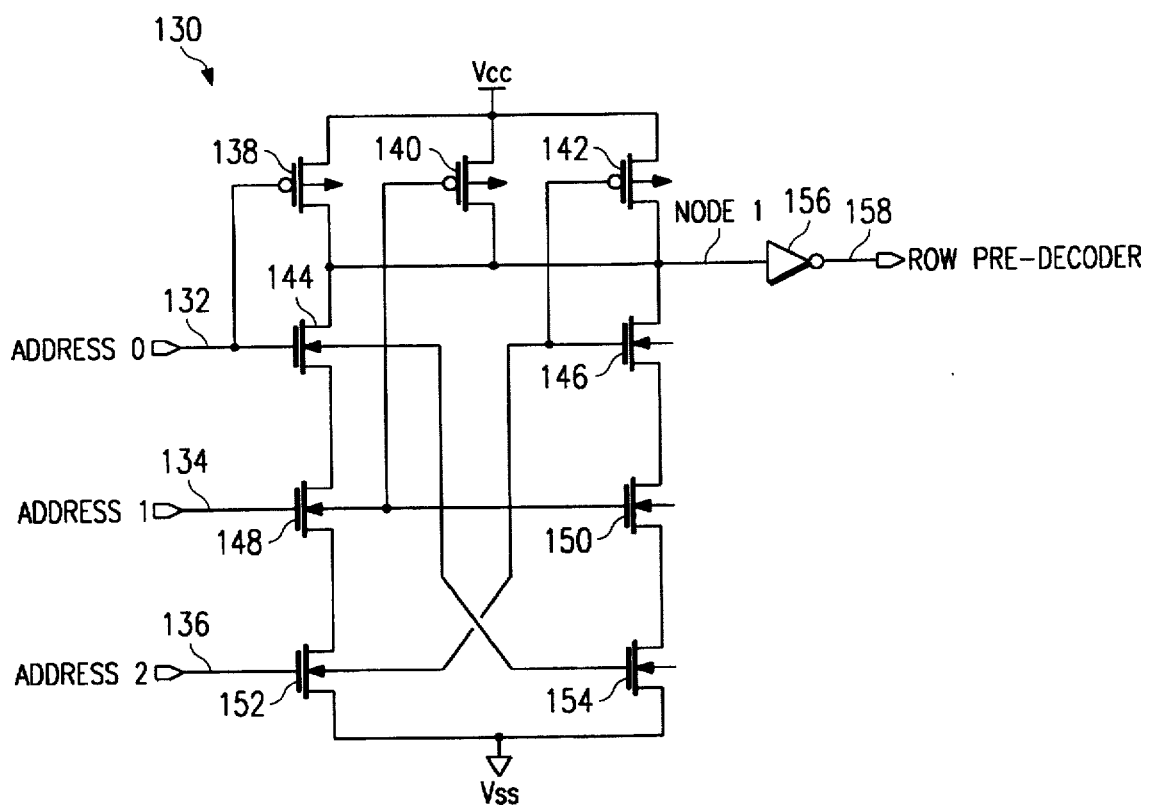
FIG. 3 is a schematic diagram of row pre-Decoder circuitry, according to the present invention.

Row Address signal 116 and Row Address bar signal 128 of Row Address Driver circuitry 100 are used to program Row Pre-Decoder circuitry 130 of FIG. 3. Row Pre-Decoder circuitry 130 has the following elements: p-channel MOS transistors 138, 140 and 142; n-channel MOS transistors 144, 146, 148, 150, 152 and 154; and inverter 156. Row Pre-Decoder circuitry 130 is supplied with three Address input signals: Address0 signal 132, Address1 signal 134 and Address2 signal 136, all of which are controlled by Row Address signal 116 and Row Address bar signal 128. Address0 signal 132 is supplied to the gates of transistors 138, 144 and 154; Address1 signal 134 is supplied to the gates of transistors 148, 140 and 150; Address2 signal 136 is supplied to the gates of transistors 152, 142 and 146.

A first source/drain of transistor 138, a first source/drain of transistor 140 and a first source/drain of transistor 142 are connected to power supply voltage Vcc. A second source/drain of transistor 138 is connected to a first source/drain of transistor 144, a second source/drain of transistor 140, a second source/drain of transistor 142 and a first source/drain of transistor 146 to form a node Node 1 which provides an input signal to inverter 156. A second source/drain of transistor 144 is connected to a first source/drain of transistor 148. A second source/drain of transistor 146 is connected to a first source/drain of transistor 150. A second source/drain of transistor 148 is connected to a first source/drain of transistor 152. A second source/drain of transistor 150 is connected to a first source/drain of transistor 154. A second source/drain of transistor 152 is connected to a second source/drain of transistor 154 and power supply voltage Vss. The output signal of inverter 156 is Row Pre-Decoder signal 158.

Row Pre-Decoder circuitry 130 of FIG. 3 is replicated in the integrated circuit device the number of times required as a function of the number of address pins of the integrated circuit device. In a large random access memory, for instance, Row Pre-Decoder circuitry 130 may be replicated forty or more times. When Address input signals 132, 134 and 136 are all a high logic state, then Row Pre-Decoder circuitry 130 is asserted and Row Pre-Decoder signal 158 is a high logic state. Conversely, if Address input signals 132, 134 and 136 are each a low logic state, then Row Pre-Decoder circuitry 130 is not asserted and Row Pre-Decoder signal 158 is a low logic state. These conditions are identical for each replication of Row Pre-Decoder circuitry 130 in the integrated circuit device.

Figure 4:
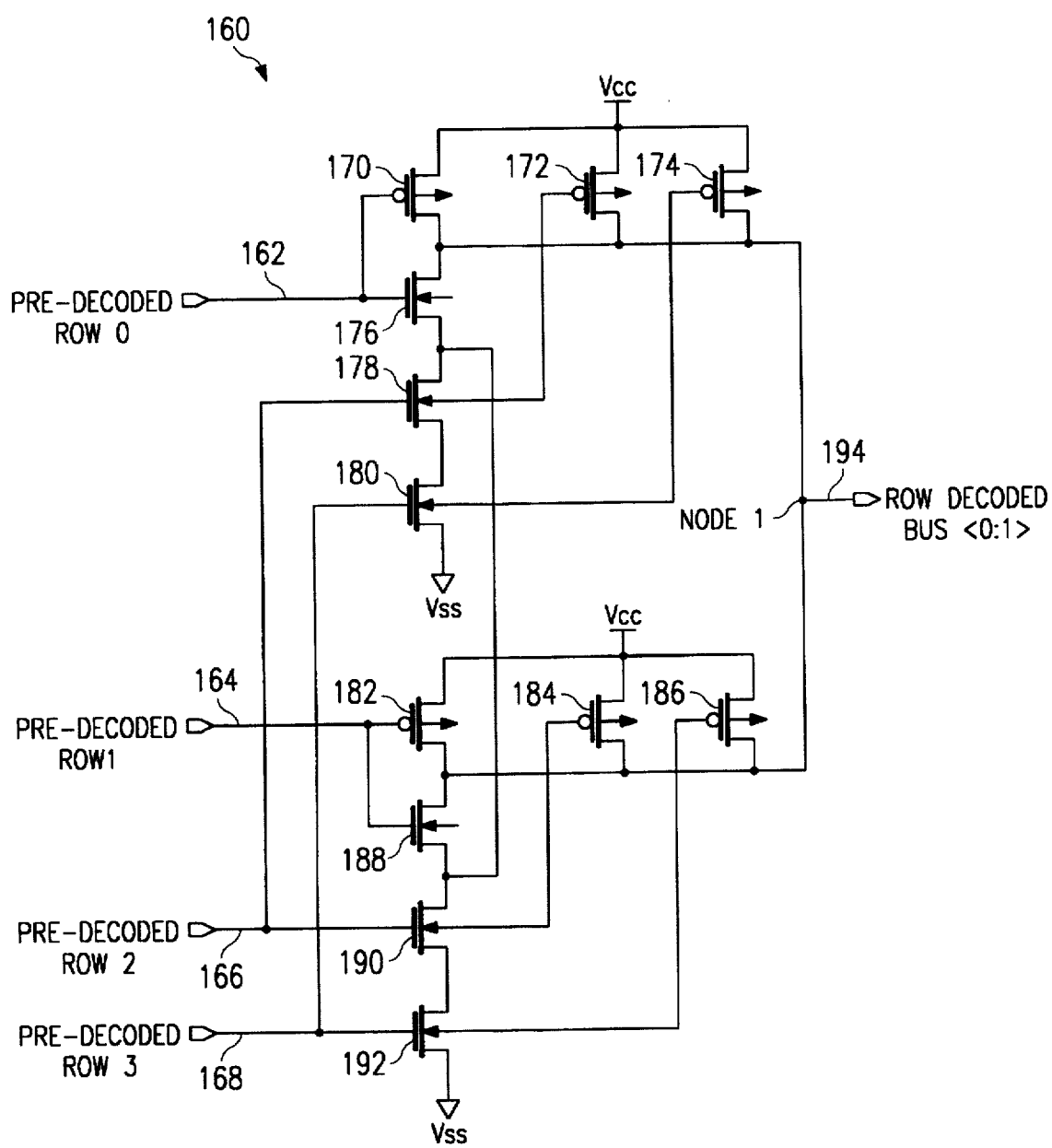
FIG. 4 is a schematic diagram of master word line decoder circuitry, according to the present invention.

When Address input signals 132, 134 and 136 are high and thus Row Pre-Decoder circuitry 130 is asserted, the high logic state of Row Pre-Decoder signal 158 feeds a final or Master Word Line (i.e. row) Decoder circuitry 160 of FIG. 4. Master Word Line Decoder circuitry 160 has p-channel MOS transistors 170, 172, 174, 182, 184 and 186 and n-channel MOS transistors 176, 178, 180, 188, 190 and 192. A number of Pre-Decoder Row signals 162, 164, 166 and 168, each of which was produced by Row Pre-Decoder circuitry 130 or a replication thereof, are provided to Master Word Line Decoder circuitry 160. For the schematic of FIG. 4, there are four Pre-Decoder Row signals and thus at least four replications of Row Pre-Decoder circuitry 130 is required to produce these four signals. Master Word Line Decoder 160 is replicated the desired number of times for the size of the integrated circuit device.

Pre-Decoded Row0 signal 162 controls the gates of transistors 170 and 176. Pre-Decoded Row1 signal 164 controls the gates of transistors 182 and 188. Pre-Decoded Row2 signal 166 controls the gates of transistors 178, 172, 190 and 184. Pre-Decoded Row3 signal 168 controls the gates of transistors 180, 174, 192 and 186. A first source/drain of transistors 170, 172, 174, 182, 184 and 186 are connected to power supply voltage Vcc. A second source/drain of transistors 180 and 192 are connected to power supply voltage Vss. A second source/drain of transistors 170, 172, 174, 182, 184 and 186 are connected to a first source/drain of transistors 176 and 188 to form Row Decoded bus 194 at Node 1. A second source/drain of transistor 176 is connected to a first source/drain of transistor 178, a second source/drain of transistor 188 and a first source/drain of transistor 190. A second source/drain of transistor 178 is connected to a first source/drain of transistor 180. Finally, a second source/drain of transistor 190 is connected to a first source/drain of transistor 192.

Master Word Line Decoder circuitry 160 of FIG. 4 has two separate decoder circuits within it and thus produces two output signals on Row Decoded bus 194 as indicated by the notation "<0:1>" on FIG. 4. Thus, a first circuit comprised of transistors 170, 172, 174, 176, 178 and 180 produce a first Row Decoded signal of Row Decoded bus 194 while a second circuit comprised of transistors 182, 184, 186, 188, 190 and 192 produce a second Row Decoded signal of Row Decoded bus 194.

When three of the four Pre-Decoded Row signals 162, 164, 166 and 168 of FIG. 4 are a high logic state, then a Row Decoded signal of Row Decoded bus 194 is a low logic state. As an example, when Pre-Decoded Row0 signal 162, Pre-Decoded Row2 166 and Pre-Decoded Row3 are each a high logic state and Pre-Decoded Row1 is a low logic state, then the decoder circuit comprised of transistors 170, 172, 174, 176, 178 and 180 is selected and generates a low logic state Row Decoded signal on Row Decoded bus 194. A low logic state on one of the Row Decoded signals of Row Decoded bus 194 feeds Master Wordline Driver circuitry of FIG. 5. Master Wordline Driver circuitry 200 contains two master wordline driver circuits which have the following elements: passgates 208 and 222 which behave as slave latches of the synchronous integrated circuit device, p-channel MOS transistors 212, 214, 226 and 228, n-channel MOS transistors 218, 220, 232 and 234, fuse elements 210 and 224, and inverters 216 and 230. Smart Clock signal 204, which is a high-going narrow pulse generated from the rising edge of Clock signal 12, and Smart Clock bar signal 206, the inverse signal of Smart Clock signal 204, control passgates 208 and 222. Smart Clock bar signal 206 further controls the gates of transistors 218 and 232. Row Decoded signal 194 are passed by slave latch passgates 208 and 222 as permitted by Smart Clock signal 204 and Smart Clock bar signal 206. Stress Mode Power-On-Reset signal 202 is the result of gating the Power-On-Reset signal of the integrated circuit device with the device stress test mode signal; thus Stress Mode Power-On-Reset signal 202 does not pulse while the integrated circuit device is in the stress test mode and only pulses when the integrated circuit device is in the normal operation mode. Stress Mode Power-On-Reset signal 202 controls the gates of transistors 212 and 226.

The output signal of passgate 208 is provided to a first terminal of fuse element 210 and a first source/drain of transistor 218. A second terminal of fuse element 210 is connected to a second source/drain of transistors 212 and 214 and an input terminal of inverter 216. A first source/drain of transistors 212 and 214, as well as a first source/drain of transistors 226 and 228, are connected to a voltage power supply Vcc as shown. A output terminal of inverter 216 controls the gate of transistor 214 and the gate of transistor 220. A second source/drain of transistor 218 is connected to a first source/drain of transistor 220. A second source/drain of transistor 220 is connected to voltage power supply Vss.

The output signal of master slave passgate 222 is connected to a first terminal of fuse element 224 and a first source/drain of transistor 232. A second terminal of fuse 224 is connected to a second source/drain of transistors 226 and 228 and to an input terminal of inverter 230. The output terminal of inverter 230 controls the gates of transistors 228 and 234. A second source/drain of transistor 232 is connected to a first source/drain of transistor 234. A second source/drain of transistor 234 is connected to power supply voltage Vss as shown. The output signals of inverters 216 and 230 form Master Row Line bus 236 at Node 1.

When three out of four of the Pre-Decoded Row signals 162, 164, 166 and 168 of FIG. 4 are a high logic state, then a Row Decoded signal of Row Decoded bus 194 is a low logic state; the other Row Decoded signal of Row Decoded bus 194 is a high logic state, thus only one pre-decoder circuit of FIG. 4 is activated. Row Decoded bus 194 feeds Master Wordline Driver circuitry of FIG. 5 which generates a Master Row Line bus 236 composed of two Master Row Line signals. Thus, if a Row Decoded signal of Row Decoded bus 194 for each replication of Master Word Line Decoder circuitry 160 is a low logic state, then all Master Row Line signals Master Row Line bus 236 for each replication of Master Wordline Driver circuitry 200 are a high logic state if Smart Clock signal 204 is a high (true) logic state. A high logic state on Smart Clock signal 204 will thus select all of the rows of the integrated circuit device if there is a high logic signal on Master Row Line bus 236. Smart Clock signal 204, however, is by definition a low true signal since Clock signal 12 was a low logic state and the low true Smart Clock signal 204 is necessary for the proper control of the slave latch passgate 208 of FIG. 5. Since Smart Clock signal 204 is a low logic state, the entire data path of the integrated circuit device may not be initialized.

Figure 6:
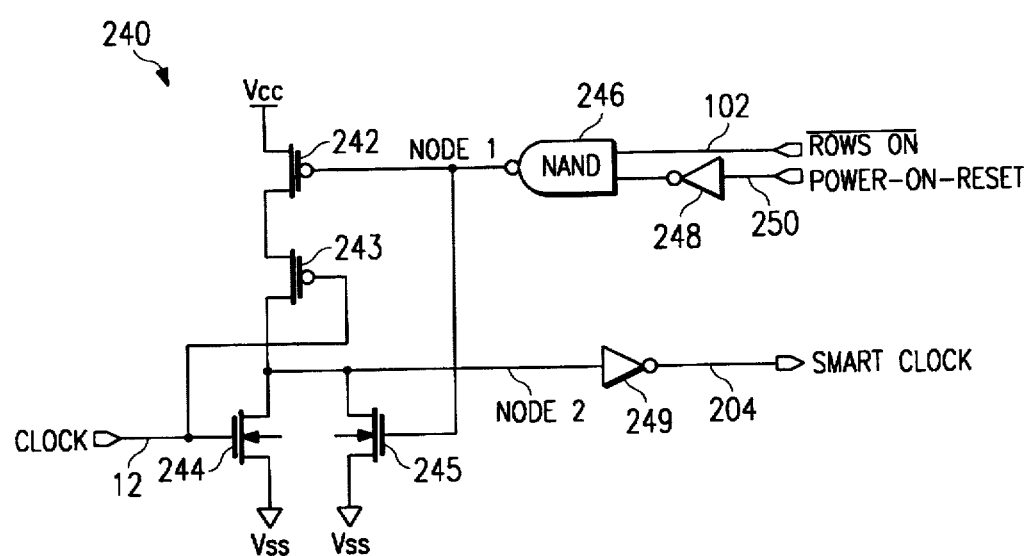
FIG. 6 is a schematic diagram of clock control circuitry, according to the present invention.

The present invention addresses this problem with the logic state of Smart Cock signal 204 by ensuring that in the stress test mode the logic state of Smart Clock signal 204 is a high logic state even if Clock signal 12 is a low logic state. Referring to FIG. 6, Clock Control circuitry 240 allows the entire data path of the integrated circuit device to be initialized by controlling the Smart Clock signal 204 during a stress test mode. Clock Control circuitry 240 is comprised of the following elements: p-channel MOS transistors 242 and 243, n-channel MOS transistors 244 and 245, NAND logic gate 246 and inverters 248 and 249. Clock signal 12 controls the gates of transistors 244 and 243. Rows On bar signal 102 is a first input signal of NAND logic gate 246 and Power-On-Reset signal 250 is inverted by inverter 248 before being presented as a second input signal to NAND logic gate 246. The output signal of NAND gate 246 at Node 1 controls the gates of transistors 242 and 245. A first source/drain of transistor 242 is connected to power supply voltage Vcc. A second source/drain of transistor 242 is connected to a first source/drain of transistor 243. A second source/drain of transistor 243 is connected to a first source/drain of transistor 244, a first source/drain of transistor 245 and a first input terminal of inverter 249 to form Node 2. The signal at Node2 is inverted by inverter 249 to form Smart Clock signal 204. A second source/drain of transistor 244 and a second source/drain of transistor 245 are connected to power supply voltage Vss as shown.

Rows On bar signal 102 is a function of a stress test mode of the integrated circuit device. Based on the stress test mode, Rows On bar signal 102 goes low to force Smart Clock signal 204 to a high logic state even if Clock signal 12 is a low logic state. Therefore, when Row On bar signal 102 is a low logic state, output signal of NAND logic gate 246 at Node 1 is a high logic state which forces the signal at Node 2 to a low logic state and Smart Clock signal 204 to the high logic state. Thus the circuitry of FIG. 6 forces the state of Smart Clock signal 204 so that it is no longer in phase with Clock signal 12 during the stress test mode. Forcing the Smart Clock signal 204 to the high logic state regardless of the state of Clock signal 12 allows the entire data path of the integrated circuit device to be properly initialized. When the entire data path is properly initialized, IN data signal 16 shown in FIG. 1 is allowed to flow completely through the integrated circuit device through both the master and slave latches, thereby overcoming the prior art difficulties.

In the prior art, the master and slave latches of a synchronous integrated circuit device generally do not conduct at the same time, thereby preventing initialization of the entire data path of the device. During normal operation either the master latches or the slave latches of the device conduct, but master and slave latches do not conduct simultaneously. The master and slave latches are generally controlled by the same clock signal and the master latch will conduct when the clock signal is equal to a first logic state while the slave latch will conduct when the clock signal is equal to a second logic state.

Figure 5:
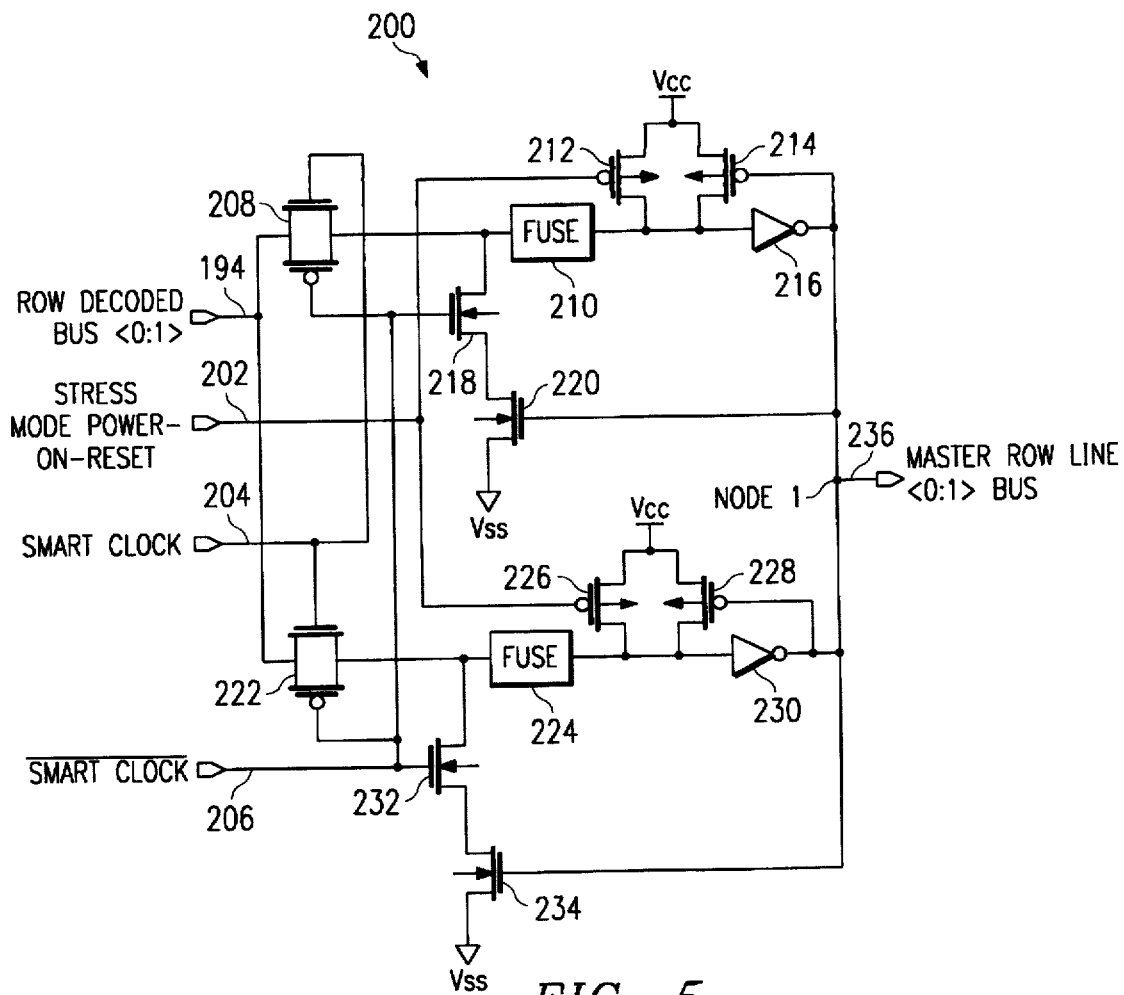
FIG. 5 is a schematic diagram of master wordline driver circuitry, according to the present invention.

The present invention addresses this prior art problem by initializing the entire data path of a synchronous integrated circuit device by causing both the master latches (flip-flops) and slave latches (flip-flops) to simultaneously conduct upon power-up of the device for the duration of the test mode. The master latch 40 is controlled by master Clock signal 12 as shown in FIG. 1. The slave latch 208 or 222 of FIG. 5 is controlled by Smart Clock signal 204, a derivative signal of Clock signal 12, which is forced to the desired logic state by Clock Control circuitry of FIG. 6. Proper manipulation of Smart Clock signal 204 by Clock Control circuitry 240 ensures that the slave latch conducts simultaneously with the master latch so that the entire data path of the synchronous integrated circuit device is initialized upon power-up in the test mode.

The present invention is desirable in any system or device employing synchronous integrated circuits. Thus it is envisioned that the present invention is suitable for use in a number of device types, including: memory devices such as SRAM (static random access memory), DRAM (dynamic random access memory) and BRAM (burst RAM) devices; programmable devices; logic devices; gate arrays; ASICs (application specific integrated circuits); and microprocessors. The present invention is further suitable for use in any system or systems which employ such devices types.

While the invention has been particularly shown and described with reference to a preferred embodiment, it will be understood by those skilled in the art that various changes in form and detail may be made therein without departing from the spirit and scope of the invention. For instance, the circuitry described herein is but one example of the row path circuitry. Other address paths will be similarly affected and will adopt the circuitry and methodology of the present invention with only minor departures from those described herein.

What is claimed is:

1. A method of initializing the data path of an integrated circuit device, comprising the steps of:

controlling a first clock signal to cause conduction of a master element of the integrated circuit device during a test mode of the integrated circuit device; and controlling a second clock signal to cause conduction of a slave element of the integrated circuit device during the test mode of the integrated circuit device;

wherein the master element and the slave element conduct simultaneously to initialize the data path of the integrated circuit device.

2. The method of claim 1, wherein the master element and the slave element conduct simultaneously to initialize the data path of the integrated circuit device upon power-up of the integrated circuit device in the test mode.

3. The method of claim 2, wherein the master element and the slave element conduct simultaneously for the duration of the test mode.

4. The method of claim 1, wherein the test mode is entered upon power-up of the integrated circuit device.

5. The method of claim 1, wherein the data path is initialized internal to the integrated circuit device.

6. The method of claim 1, wherein the second clock signal is controlled to cause conduction of the slave latch element regardless of a logic state of the first clock signal.

7. The method of claim 6, wherein the second clock signal is controlled to cause conduction of the slave latch element by a clock control circuit.

8. The method of claim 1, wherein the first clock signal is a master clock signal and the second clock signal is a derivative signal of the master clock signal.

9. The method of claim 8, wherein the master clock signal is a signal external to the integrated circuit device.

10. The method of claim 1, wherein the integrated circuit device is a synchronous integrated circuit device.

11. The method of claim 1, wherein the master element is a master latch element and the slave element is a slave latch element.

12. The method of claim 1, wherein the master element is a master flip-flop element and the slave element is a slave flip-flop element.

13. The method of claim 1, wherein the data path is an address path.

14. The method of claim 1, wherein in the test mode the integrated circuit device is tested at a super voltage above a normal operating voltage of the integrated circuit device.

15. The method of claim 14, wherein the data path is tested in both a first logic state and a second logic state of a clock signal at the super voltage.

16. The method of claim 1, wherein the integrated circuit device is a synchronous clocked device.

17. The method of claim 1, wherein conduction of the master element and conduction of the slave element initializes an address path of the integrated circuit device such that a plurality of columns and a plurality of rows of the integrated circuit device are not selected.

18. The method of claim 1, wherein conduction of the master element and conduction of the slave element initializes an address path of the integrated circuit device such that a plurality of columns and a plurality of rows of the integrated circuit device are selected.

19. The method of claim 18, wherein when the address path of the integrated circuit device is initialized, a plurality of bitlines true of the integrated circuit device are held at a first voltage level and a plurality of bitlines complement of the integrated circuit device are held at a second voltage level.

20. Circuitry for initializing a data path of a synchronous integrated circuit device, comprising:

a clock control circuitry, having a first clock signal as an input signal and a test mode signal as an input signal and generating a second clock signal, which causes a master element of the integrated circuit device to conduct as a function of the first clock signal; and a slave element of the integrated circuit device which is caused to conduct as a function of the second clock signal generated by the clock control circuitry;

wherein when the test mode signal is equal to a first logic state, the integrated circuit device is in a normal operating mode during which the master element conducts and wherein when the test mode signal is equal to a second logic state, the integrated circuit device is in a test mode during which the master element and the slave element conduct simultaneously.

21. The circuitry of claim 20, wherein the clock control circuitry for controlling the second clock signal to cause conduction of the slave element of the synchronous integrated circuit device comprises:

a first transistor element, having a first terminal connected to a first supply voltage;

a second transistor element, having a first terminal connected to a second terminal of the first transistor element and a control element controlled by the first clock signal;

a third transistor element, having a first terminal connected to a second terminal of the second transistor element, a second terminal connected to a second supply voltage and a control terminal controlled by the first clock signal;

a fourth transistor element, having a first terminal connected to the first terminal of the third transistor element to produce the second clock signal of the clock control circuitry and a second terminal connected to the second supply voltage; and a logic gate, having a control signal as an input signal and producing an output signal which controls a control terminal of the first transistor element and a control terminal of the fourth transistor element;

wherein the second clock signal can be forced to a logic state regardless of the first clock signal.

22. The circuitry of claim 21, wherein the control signal is a derivative signal of the test mode signal of the synchronous integrated circuit device.

23. The circuitry of claim 21, wherein the first transistor element is a p-channel transistor, the second transistor element is a p-channel transistor, the third transistor element is an n-channel transistor and the fourth transistor element is an n-channel transistor.

24. The circuitry of claim 21, wherein the first clock signal is a clock signal external to the synchronous integrated circuit device.

25. The circuitry of claim 21, wherein a power-on-reset signal is an input signal of the logic gate.

26. The circuitry of claim 25, wherein the second clock signal can be forced to the logic state as a function of the control signal and the power-on-reset signal.

27. The circuitry of claim 21, wherein the first supply voltage is Vcc and the second supply voltage is Vss.

28. The circuitry of claim 21, wherein the logic gate is a NAND logic gate.

29. The circuitry of claim 21, wherein the data path is an address path.

30. The circuitry of claim 21, wherein in the test mode the integrated circuit device is tested at a super voltage above a normal operating voltage of the integrated circuit device.

31. The circuitry of claim 21, wherein the data path is tested in both a first logic state and a second logic state of a clock signal at the super voltage.

32. The circuitry of claim 20, wherein the synchronous integrated circuit device is a synchronous clocked device.

33. The circuitry of claim 21, wherein conduction of the master element and conduction of the slave element initializes an address path of the integrated circuit device such that a plurality of columns and a plurality of rows of the integrated circuit device are not selected.

34. The circuitry of claim 21, wherein conduction of the master element and conduction of the slave element initializes an address path of the integrated circuit device such that a plurality of columns and a plurality of rows of the integrated circuit device are selected.

35. The circuitry of claim 34, wherein when the address path of the integrated circuit device is initialized, a plurality of bitlines true of the integrated circuit device are held at a first voltage level and a plurality of bitlines complement of the integrated circuit device are held at a second voltage level.

36. The circuitry of claim 21, wherein the master element and the slave element conduct simultaneously to initialize the data path of the integrated circuit device upon power-up of the integrated circuit device in the test mode.

37. The circuitry of claim 36, wherein the master element and the slave element conduct simultaneously for the duration of the test mode.

38. The circuitry of claim 21, wherein the test mode is entered upon power-up of the synchronous integrated circuit device.

39. The circuitry of claim 21, wherein the first clock signal is initialized internal to the synchronous integrated circuit device.

40. The circuitry of claim 21, wherein the second clock signal is controlled to cause conduction of the slave latch element regardless of a logic state of the first clock.

41. The circuitry of claim 40, wherein the second clock signal is controlled to cause conduction of the slave latch element by the clock control circuitry.

42. The circuitry of claim 21, wherein the first clock signal is a master clock signal and the second clock signal is a derivative signal of the master clock signal.

43. The circuitry of claim 42, wherein the master clock signal is a signal external to the synchronous integrated circuit device.

44. The circuitry of claim 21, wherein the master element is a master latch element and the slave element is a slave latch element.

45. The circuitry of claim 21, wherein the master element is a master flip-flop element and the slave element is a slave flip-flop element.

* * * * *